United States Patent [19]
Bogursky et al.

[11] Patent Number: 5,616,053
[45] Date of Patent: Apr. 1, 1997

[54] CONTINUOUS MOLDED ELECTRICAL CONNECTOR

[75] Inventors: Robert M. Bogursky, Encinitas; Michael Krupin, San Diego; Peter V. Bellantoni, Vista; Martin E. McGrath, San Diego, all of Calif.

[73] Assignee: Auto Splice Systems, Inc., San Diego, Calif.

[21] Appl. No.: 498,536

[22] Filed: Jul. 5, 1995

[51] Int. Cl.[6] .................................................. H01R 13/40
[52] U.S. Cl. ............................ 439/590; 439/885; 439/937; 29/883; 29/884
[58] Field of Search ............................ 439/78, 590, 885, 439/937; 29/842, 883, 884; 264/40.1, 40.5, 255, 308

[56] References Cited

U.S. PATENT DOCUMENTS

| | | | |
|---|---|---|---|
| 2,396,725 | 3/1946 | Thomas, Jr. | 173/324 |
| 3,471,900 | 10/1969 | Burns | 18/36 |
| 4,230,387 | 10/1980 | Zahn . | |
| 4,391,482 | 7/1983 | Czeschka . | |
| 4,404,744 | 9/1983 | Stenz et al. | 29/883 |
| 4,617,733 | 10/1986 | Olson | 29/874 |
| 4,655,517 | 4/1987 | Bryce . | |
| 4,686,766 | 8/1987 | Dubbs et al. | 29/883 |
| 4,832,622 | 5/1989 | Zahn | 439/590 |
| 4,961,895 | 10/1990 | Klein | 264/40.6 |

*Primary Examiner*—Khiem Nguyen

[57] ABSTRACT

A continuous electrical connector or related part manufactured by injection molding axial segments in sequence. A novel in-line interlocking structure is provided for interlocking adjacent segments. The interlocking structure comprises holed end units nested together with their holes in alignment.

21 Claims, 5 Drawing Sheets

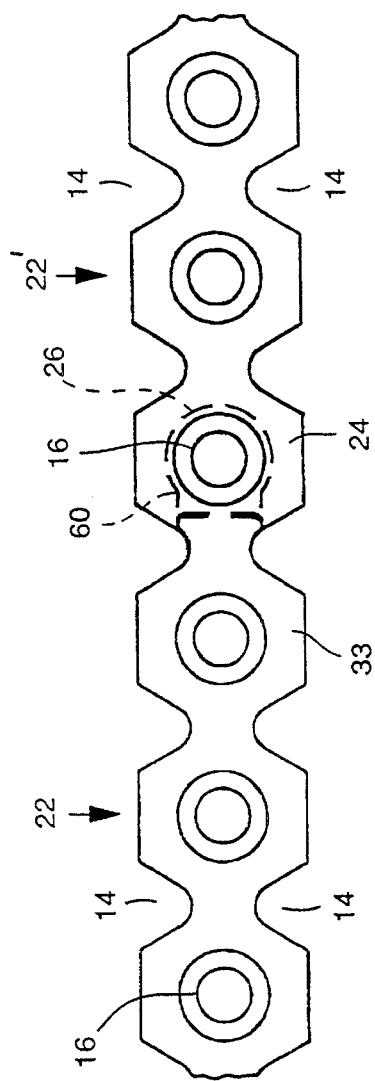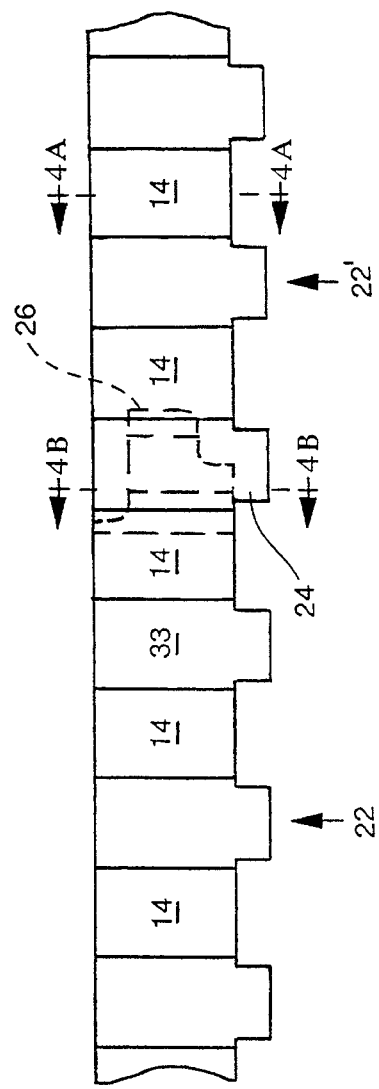

CONTINUOUS MOLDED ELECTRICAL CONNECTOR

This invention relates to the manufacture of continuous molded electrical connectors, and to the resultant strip of electrical header material.

BACKGROUND OF THE INVENTION

Electrical connectors comprising insulating body having electrical contacts carried thereby are well own in the art. In the so-called male pin connectors, the insulating body carries pin-like contacts which extend above and below the insulating body to facilitate electrical connection from one element, such as a printed circuit board (PCB), to another element, which may, for example, comprise a so-called female connector. As is well known, a female connector comprises an insulating body which carries an electrical contact which is generally capable of receiving at one end thereof a male pin, and at the other end thereof an electrical conductor which may be another male pin, a single electrical conductor, or a single strand of a multiconductor flat ribbon cable. Typically, the aforedescribed male connector and female connector are utilized in a tandem or coupled fashion to provide electrical connection from one element such as the printed circuit paths on a PCB to individual conductors or the multiple conductors of a multiconductor ribbon cable.

The aforedescribed male and female type connectors are generally manufactured with a predetermined number of contacts carried thereby. For example, a typical male connector of the type described above might comprise a length of insulating material having two, ten, twenty, thirty, or any number of pins carried thereby. Similarly, a female connector may comprise a body of insulating material having individual cavities disposed therein, each cavity of which carries an electrical contact. Like the male connectors, the female connectors are commonly manufactured with two, ten, twenty, thirty, etc., contacts.

There are drawbacks associated with the manufacture and use of both male and female connectors of the type described above. The end user may use several connectors, each having a different number of electrical contacts or "positions". He must therefore purchase and inventory many different connector sizes, i.e. he must maintain a supply of 8-position, 12-position, 20-position connectors, etc.

A continuous connector strip for solving this problem was disclosed in U.S. Pat. No. 4,230,387. U.S. Pat. No. 4,832,622 (the '622 patent), whose contents are herein incorporated by reference, describes a better solution to the problem involving continuous extrusion or semi-continuous injection molding. Problems with the continuous extrusion scheme are that only simple header configurations are possible, and the extruded strip must in a subsequent step have holes punched and notches formed. While the semi-continuous injection molding scheme avoids the foregoing problems, it also has drawbacks, which will be best understood from the following description.

The latter method involves use of an angled protuberance (108) (see FIG. 11A of the '622 patent) on the end of a longitudinal spine (106) extending along the strip edge and which serves as the connection device for a number of units (102) which are each composed of a discretely molded segment. After the injection molding and cooling process, each discretely molded segment is removed from the mold cavity and indexed into a position such that the next discretely molded segment will in turn encapsulate, fuse or overmold the protuberance (108) of the previous segment. In this method, the protuberance (108) of the previous segment becomes encapsulated in or fused into the spine (106) and leading end unit (102) of the segment currently being molded. This achieves the interlocking of the two discretely molded segments to form a continuous length.

A first drawback with this method is that, the act of removing the discretely molded segment from the mold and indexing into a position such that the next cycle of the injection mold will encapsulate or fuse the protuberance in exactly the correct position is something that must be done with the highest precision, or the two strips will be out of pitch. Pitch is defined as the distance from one electrical connection device (pin, socket, etc.) to the adjacent one, and is of critical importance to the end assembler of the devices, who has to assemble, for example, a female connector with socket connectors of a given pitch to a male connector with pin connections of the same pitch. This method of interlocking the two discretely molded segments relies entirely on the repositioning of the first segment in precisely the correct location with relation to the mold cavity that will in turn mold the next segment. This is not easy to accomplish in the method described in the '622 patent.

A second drawback of the method presented above is the possibility of having weak joints due to poor materials, poor design, or improper processing conditions during the injection molding process. Weak joints would be subject to breakage, causing the two discretely molded segments to separate during the interconnecting device insertion process, shipment or during the end user's assembly process.

SUMMARY OF THE INVENTION

An object of the invention is an improved semi-continuous injection molding process for molding a continuous strip of insulating material with holes for receiving electrical or mechanical parts.

Another object of the invention is a continuous strip of injection molded insulating material provided with holes for receiving electrical or mechanical parts and preferably with severance means, such as notches, for severing from the strip discrete lengths of the material for use, for example, as electrical headers, said strip having been made by separately molding discrete segments, wherein the discrete segments are interconnected by a stronger interlocking structure.

In accordance with one aspect of the present invention, each segment has a trailing projecting portion, substantially in-line with the strip, with undercuts or recessed regions behind the projecting portion. The projecting portion of each previously-molded segment is reinserted in the mold and the leading portion of the next segment molded over and around the projecting portion to provide a strong interlocking structure substantially in-line with the connector strip.

In a preferred embodiment, the projecting portion has a hole for receiving an electrical or mechanical part, and the overmolded part also has a hole, with both holes aligned to receive the electrical or mechanical part. In this way, despite the fact that the resultant interlocking structure is in-line in the strip, a space for an electrical or mechanical part is not lost, so that for an application where, say, electrical pins are provided in evenly-spaced holes in the strip, a pin can also be placed in the aligned holes of the interlocking structure to maintain the symmetry.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

SUMMARY OF THE DRAWINGS

In the drawings:

FIGS. 5 and 6 are plan and elevational views, respectively, of the segment of FIG. 4;

DETAILED DESCRIPTION OF PREFERRED EMBODIMENTS

Figure 1:
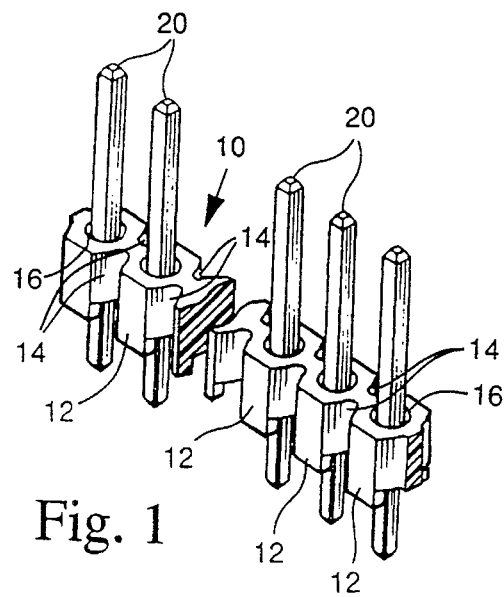
FIGS. 1 and 2 are perspective view of continuous strips of one row and two rows, respectively, of pin connectors in accordance with the invention.
Figure 2:
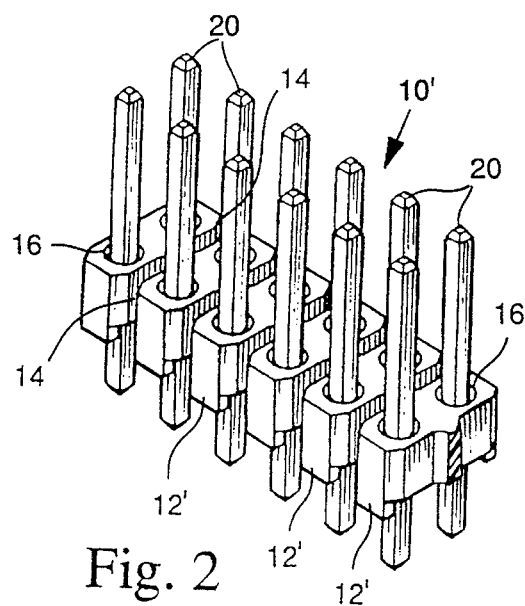

The '622 patent illustrates various pin header configurations available from a continuous strip of insulating material with holes filled with contact elements. FIGS. 1 and 2 illustrate comparable parts available from a continuous strip according to the invention.

The continuous strip 10 comprises, integrally connected, individual units 12 separated by severance means, in this instance spaced pairs of notches 14 between each unit 12 forming weakened regions where the strip can easily be severed to form one or multiple pin headers. The notches also assist in flexing of the strip for later coiling on a reel, provides a convenient reference point for indexing of the strip, and determines a specific web size between units 12 to control unit spacing. Each of the units 12 in this case have vertical through-holes 16, beveled 18 at the top or bottom, for receiving straight pin terminals 20.

The pins 20 have a substantially square cross section, or alternatively of a different cross-section, such as round or rectangular, and also may have an expanded "star" section in the area covered by the plastic header for improved strength and for form-fitting with the insulating plastic to prevent longitudinal displacement of the inserted pins. The sides of the strip 10 have the notches 14 formed therein, which notches are substantially U-shaped. The U-shaped notches 14 are directed substantially perpendicular to the longitudinal axis of the strip 10. By severing the strip at the two opposing notches, an electrical connector having a predetermined number of pin terminals can be formed. In the description which follows, the method of the invention will be described in connection with the manufacture of a single-row connector. However, other connectors, such as those shown in FIG. 2 and in FIGS. 2–4 of the '622 patent, can be manufactured in accordance with the invention.

FIG. 2 is a view of a double-row strip 10' according to the invention, with each unit 12 containing two holes 16 each containing a pin 20, with each unit 12' separated by pairs of notches 14. In this case, the strip 10' is wider than the strip shown in FIG. 1 so that pairs of holes 16 can be formed for receiving the two rows of straight pins 20.

The method according to the invention is not limited to the formation of continuous connector strip having straight pin terminals. FIG. 3B of the '622 patent shows an end view of an endless connector having right-angle pin terminals inserted in holes formed in the strip, and FIG. 4B of the '622 patent shows a strip having two rows of right-angle pin terminals. Although the connector strip shown are provided with pin terminals, it is apparent that an electrical connector can be manufactured according to the invention having any type of electrical components inserted in the continuous strip.

Figure 3:
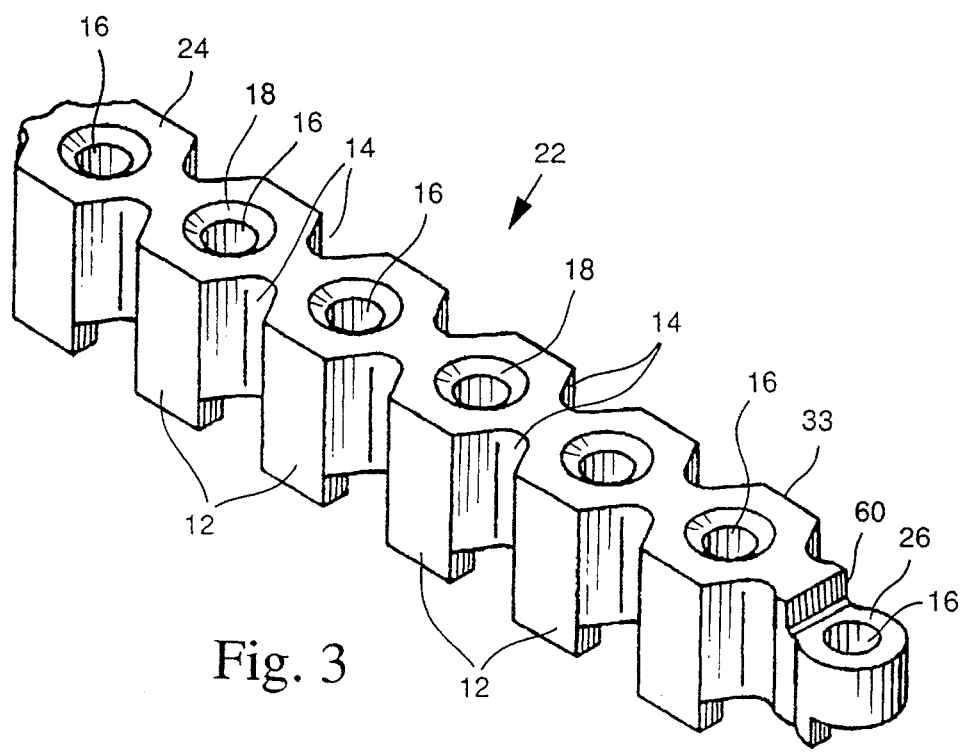
FIG. 3 is a perspective view of one molded segment of a continuous connector strip as shown in FIG. 1.

FIG. 3 illustrates what is herein termed one segment 22 of the continuous strip, which is made up of a plurality of such segments 22 interlocked or fused together. Each segment 22 is constituted of a plurality of units 12, and includes end units comprised of a leading end unit 24 and a trailing end unit 26 (explained below), each with the approximately same sized hole 16 as the middle units 12 between the end units 24, 26.

Figure 7:
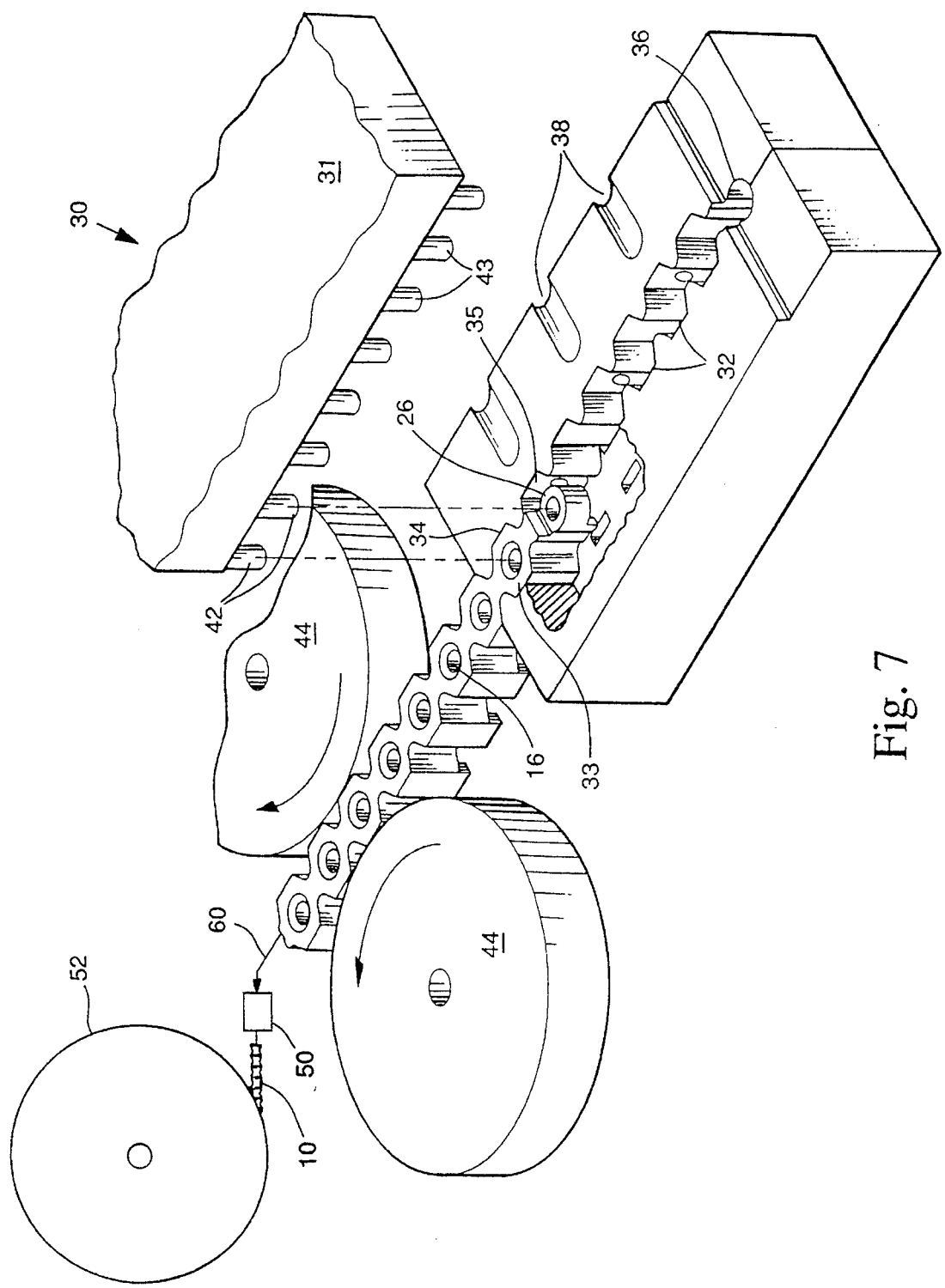
FIG. 7 illustrates manufacture of a continuous strip according to the invention.

A feature of the invention is the use of the end units 24, 26 of adjacent segments 22 to form a strong interlocking structure connecting the discretely molded segments 22 into a continuous strip 10. This is accomplished with an improved style of interlocking feature, which in addition also uses core pins in the mold cavity to assure positive alignment of the previously molded segment. A typical injection mold for plastic material is shown in FIG. 7 at 30, divided into 2 halves. The mold top 31, which seals off the mold cavities 32 at top, is shown separately for simplicity. The cavities 32 have the configuration to mold a single segment 22, with the cavity 34 at the left end for receiving the previously molded segment unit 33 next to the previously molded trailing end unit 26, the cavity 35 next to the end cavity 34 for receiving the trailing end unit 26 of the previously molded segment and for overmolding over the end unit 26 the leading end unit 24 of the next segment, and the cavity 36 at the right end for molding the trailing end unit 24 of the next segment. Only the parts 33 and 26 of the previous segment are shown, the new segment yet to be molded is not shown.

After each molding cycle, still to be described, when the mold halves are separated, ejector means (not shown) will free the just-molded segment, so it can be advanced as shown by the arrow 60. Subgates 38 provide passageways for the molten plastic. During the molding process, inert core pins 42, 43 mounted on the top mold part 31 are positioned in each cavity where a hole 16 is to be formed. The lateral spacing of the core pins 42, 43 is determined by their mounting in the top core half 31.

The end unit 26 has a hole 16 molded into it that is in pitch with all the other holes 16 in the insulating segment 22 which will in a later process have interconnect devices (pins/socket/etc.) inserted into them. After the first (called previous) discrete segment is molded and cooled, the mold halves are separated and the just-molded segment is ejected and indexed for the next cycle of the mold. After the mold halves are separated, the discretely molded previous segment is ejected from the mold cavity and indexed by a mechanism such as the motor driven gears 44 shown to the proper position for the next molding cycle. In this position, the unit 33 next to the interlock end unit 26 as well as the latter are both retained or reinserted in the end cavities 34, 35 of the mold. When the mold halves are closed in preparation for the next molding cycle, the core pins 42 of the two end-most positions 34, 35 go into the holes of the unit 33 next to the interlocked units and the end unit 26 into the cavity bottom if a through-hole is to be made. This serves to assist in the final location of the previously molded segment with relation to the cavity which will mold the next segment. Any minute error in the initial location of the previously molded segment is corrected by the positive positioning provided by the two core pins 42 going into the two holes in the two units 33, 26 which remain in the mold and whose lateral spacing is fixed by the mold.

The next cycle of the mold fills the cavities with molten plastic, and encapsulates the trailing end unit 26 inside the overmolded part 24 of the next segment. The design of the interlock feature is such that the interlock joint is not the weak joint of the system. This is obtained by making the strength of the trailing end and leading units approximately the same, so that the combined strength of the overmolded interlocked joint is approximately the same as that of the middle units, which makes the notched regions the weakest links in the strip. In a preferred embodiment, substantially equal strength is obtained by a configuration of the trailing end 26, at the cross-sectional area indicated by 70 in FIG. 4B, that is substantially the same as the cross-sectional area at the smallest section of the web, indicated at 71 in FIG. 4A. In other words, even in the molded state (prior to interconnect device insertion into the insulator), the interlock joint is stronger in tension, bending and twisting than the webs between the notches 14 that separate each unit of the discretely molded segment. This is an important feature so that the process that follows the injection molding, typically interconnect device insertion, can utilize the full range of flexibility and strength of the discretely molded segments, and not be limited by the joint at the interlocking units.

A further feature of the invention is that, even though the design is such that the interlock area is not the weakest link in the strip, a factor of safety is achieved by device insertion. Once a pin or other electrical or mechanical part is inserted into the aligned holes 16 that is the trailing end unit 26 and the over molded material from the subsequent mold cycle forming the leading end unit 24, the two discrete segments are truly locked together. This is an important feature because, even though the interlocking mechanism is designed to be stronger in tension, bending and twisting than the webs of the discretely molded segments, improper processing conditions or the need for certain materials which may not fuse together during molding, may lead to the condition where eventually the end unit 26 from the previous segment can be removed from the encapsulating material 24 of the next segment. Once, however, a pin for example, is inserted into the aligned holes 16, the two segments are positively locked together and a higher strength preventing separation is achieved.

Another benefit of the invention is that, when the molten plastic is injected into the cavity, it is done so at an extremely high pressure. In the design described in the '622 patent, the protuberance from the previous segment which extends into the cavity segment will experience high stresses from this high pressure molten plastic. This stress can damage or weaken the protuberance resulting in a weak joint which is undesirable. In the present invention, the inner end unit 26 is not free to move or flex in the cavity, as it is held tightly in position by the core pin 42 that goes through the hole in it, thereby securing it in place. Because the end unit can not move when subjected to the flow of molten plastic at such high pressures, it will not be damaged or weakened in the injection molding process, and will retain its mechanical properties, providing a strong interlocking joint.

The indexing mechanism 44 is easily controlled to advance each previous segment to the proper position for the core pins 42 to align same for the next molded segment. The positive alignment provided by the core pins insure proper unit to unit pitch.

Figure 4:
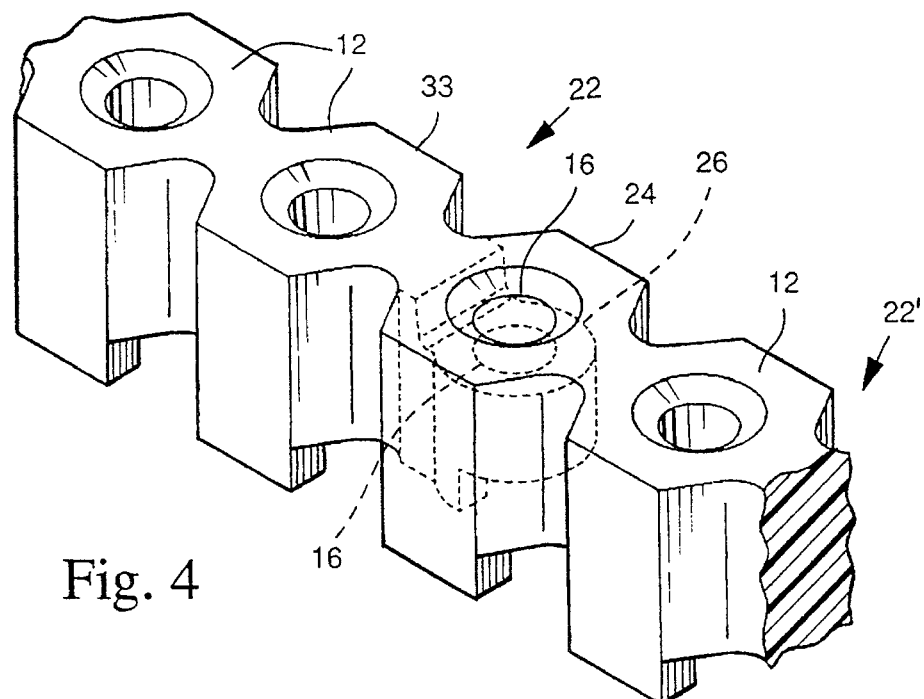
FIG. 4 is a perspective view showing how the end regions of adjacent segments form an interlocking structure according to the invention.
Figure 4A:
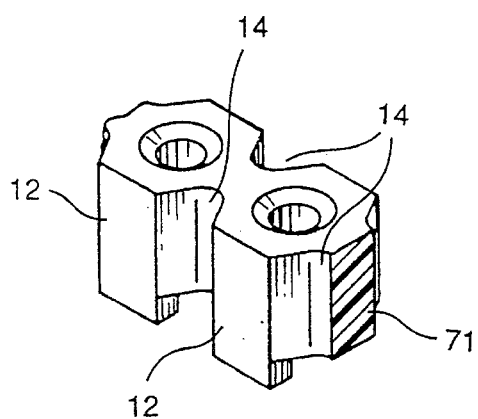
FIGS. 4A and 4B are cross-sections of the structure of FIG. 4 taken along the lines 4A—4A and 4B—4B, respectively, of FIG. 6.

FIG. 4 shows at the left the previous segment 22 with trailing end unit 26 nesting within the overmolded leading end unit 24 of the next segment 22', with their respective holes 16 aligned to received a common electrical or mechanical element.

Figure 8:
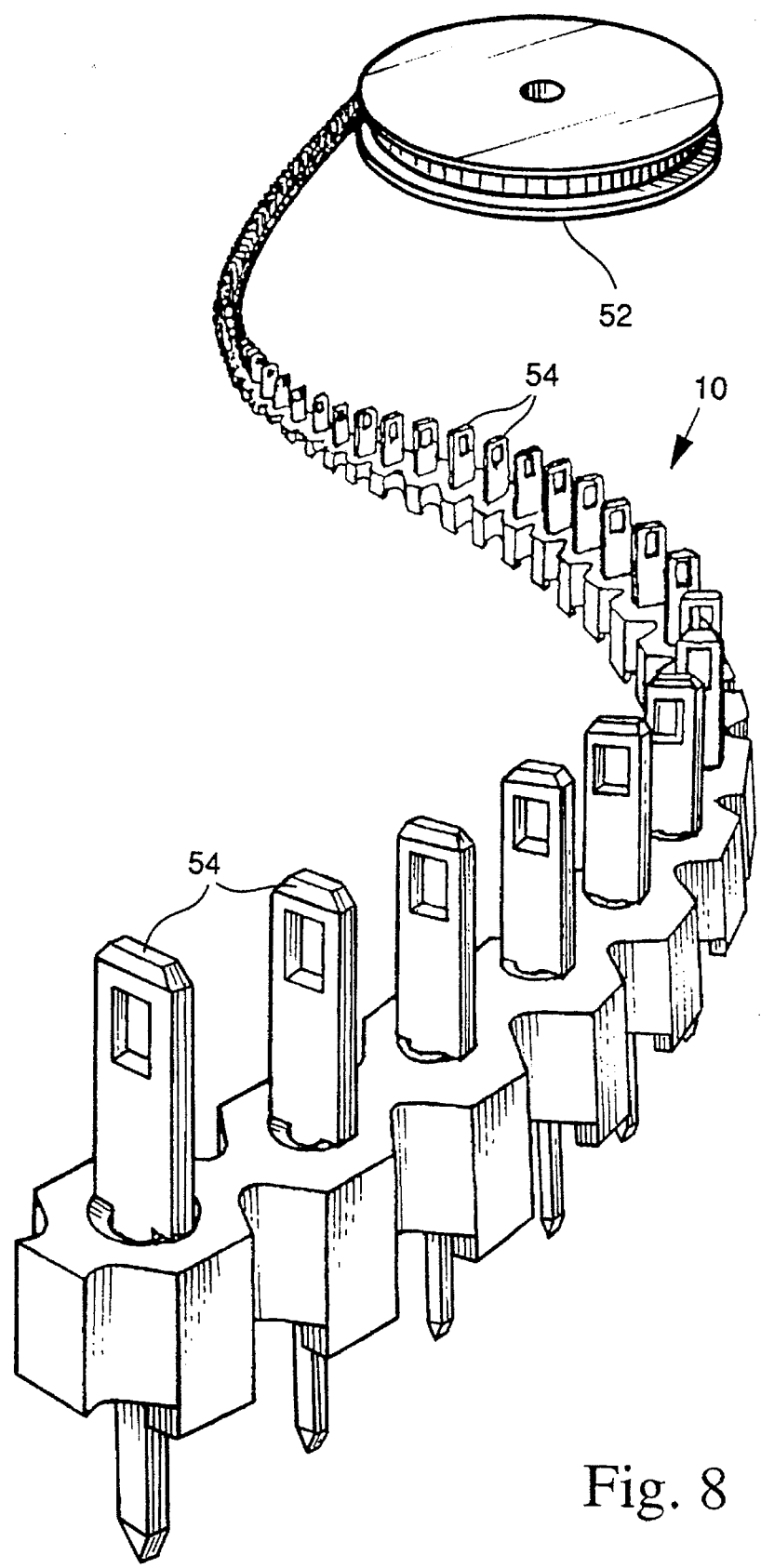
FIG. 8 illustrate how the user would receive a reeled continuous strip.

As shown in FIG. 7, as the continuous strip 48 formed of successive interlocked molded segments 22 is molded in this step-by-step, indexing process, it can be passed through a known inserter machine 50 for inserting pins or other elements into some or all of the holes 16 of the strip, and then the resultant strip 10 wound up in a continuous fashion on a reel 52 for distribution to a user. From the reel 52, the user at a PCB manufacturing station can unreel the strip 10 either manually or automatically by machine—shown in FIG. 8 with tab electrical connectors 54—and as described sever sections with the desired number of tabs for mounting onto a PCB by an inserter machine.

While the more common application of the invention will involve electrical contacts, such as pins, sockets, tabs, terminals and the like, for receiving electrical connectors, there are also mechanical applications of the invention. One such example can be found in U.S. Pat. No. 5,148,596, (also incorporated herein by reference) which, in the embodiment disclosed in FIGS. 18–22, describes the insertion of posts on a PCB to serve as mechanical guides for electrical connectors. Such posts can also be inserted in holes in the continuous molded strip of the invention, and positions containing one or more posts severed from the continuous strip for mounting on the PCB. In this instance, the posts need not extend completely through the holes in the strip, as would normally be preferred for electrical contacts where the portions protruding from the bottom can be used for mounting of the header on the PCB, as well as for making additional circuits connections on the opposite side of the PCB. It will also be appreciated from this application that the holes in the strip need not be through-holes, but can also be blind holes for receiving mechanical or electrical parts.

Similarly, while the more common and preferred arrangement employs evenly spaced through-holes with each hole in both the end and middle units filled with an electrical contact, there can be users for uneven patterns of contacts. Thus, holes are not essential in all the units, nor are contacts essential in all the holes. Holes, through or blind, need only be located where needed or to receive a core pin.

Similarly, with a strip of equally spaced holes and contacts, it is preferred to mold sets of notches separating each contact, allowing any desired header length to be severed at any of the notched separators. However, if the user has a need for, for example, 3-pin headers, then notches need only be provided between every third and fourth pin where severing will occur. Alternatively, if the user needs both 2-pin and 3-pin headers, then the notches need only be provided at 3 and 4 pin positions, thus where the user intends to sever discrete header components.

It will also be appreciated that other structures capable of weakening the strip along discrete lengths thereof, for easy separation of the strip at the weakened regions, can be substituted for the notches.

The number of units provided in each segment is not critical. It can vary from 3 to more than 50, depending on mold and part size. A typical value would be about 32 units with a pitch of about 0.1 inches, a height of about 0.1 inches, for 0.025 inch square standard pins, and with a web width, between the notches, of about ⅓ the unit width.

As will be observed in FIGS. 3 and 5, the trailing end unit 26 forms a kind of knob-shaped in-line protuberance with a recessed or reduced width section 60 behind the front axial surface. As a result, material of the overmolded leading end unit 24 extends into this reduced width section which enhances the interlocking of the two segments. As an alternative, if the position is not needed by the customer, the core pin 42 which engages the hole 16 in the end unit 26 may be omitted. As a result, injected plastic will fill that hole 16 and provide additional strength to the assembly of segments. The remaining core pin 42 will still function for alignment of adjacent segments. Other core pins 43 may also be eliminated if desired.

The use of semi-continuous injection molding offers several advantages over extrusion. Holes with lead-ins—the bevels 18—may be molded directly. Higher-temperature plastics can be used. Greater dimensional accuracy is possible. Pitch is more consistent. The parts are cleaner since no plastic need be removed as is required for extrusion. Also secondary machining or punching operations necessary with extrusions are eliminated.

Figure 4B:
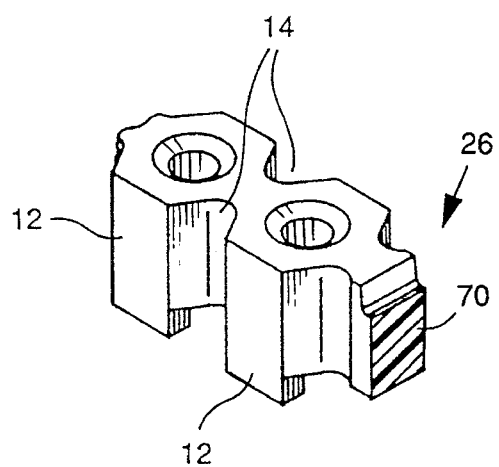

The shape and size of the knob-shaped end 16 is preferably chosen such that its strength is approximately the same as the strength of the overmolded plastic that encapsulates the knob-shaped end, so together they provide a strength of plastic substantially equal to that of one of the middle units 12, which contributes to the strength of the interlocking structure thus formed. Substantially equal strength can be obtained by making the volume of the trailing end 16 approximately the same as the volume of the overmolded plastic. To further ensure that the notched region represents the weakest link to ensure severing at the proper locations, in a further prepared embodiment, preferably the cross-section of the section 70 shown by hatching in FIG. 4B is equal to or larger than the smallest cross-section 71 through the center of the web between a pair of notches 14.

The core pins need not be round, as shown. They can also be rectangular, square or otherwise shaped as required for the part to be subsequently inserted.

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A continuous elongated injection-molded length of insulating material containing a plurality of spaced approximately in-line electrical or mechanical parts inserted in and along substantially the entire length of said insulating material, comprising:

(a) a consecutive series of injection-molded segments of insulating material, (b) each segment comprising a consecutive series of connected integral, insulated units comprised of first leading and second trailing end units and a plurality of middle units between the end units, said middle units each being of insulating material and separated along their length from each other by severance means, some middle and end units containing holes for receiving an electrical or mechanical part, the first and second end units forming portions in line with the spaced electrical or mechanical parts, (c) except for the end segments, the second end unit of each segment being nested within the first end unit of the adjacent segment whereby successive segments are integrally coupled by their respective second and first end units with their respective holes aligned to receive a common electrical or mechanical part, (f) electrical or mechanical pans being mounted into holes of the middle units and into the aligned holes of the nested end units of some of the segments.

2. The product of claim 1, further comprising a reel, said elongated length of insulating material with electrical or mechanical parts being wound up on the reel.

3. The product of claim 1, wherein the second end unit is generally knob-shaped.

4. The product of claim 3, wherein the strength of the second end unit is approximately one-half of the combined strength of the second end unit and its nested first end unit.

5. The product of claim 3, wherein the volume of the second end unit is approximately one-half of the combined volume of the second end unit and its nested first end unit.

6. The product of claim 1, wherein the severance means are sets of notches.

7. The product of claim 6, wherein the cross-section of the second end unit, adjacent the hole, is equal to or greater than the smallest cross-section of the strip at the notches.

8. The product of claim 4, wherein the electrical or mechanical part is an electrical contact.

9. A method of forming a continuous elongated injection-molded length of insulating material for receiving a plurality of spaced approximately in-line electrical or mechanical parts, inserted into and along substantially the entire length of said insulating material, comprising the steps:

(a) providing a mold shaped to form one segment of insulating material, said one segment comprising a consecutive series of connected, integral, insulated units comprised of first and second end units and a plurality of middle units between the end units, some of the middle and end units containing holes for receiving an electrical or mechanical part, the first and second end units forming projecting portions approximately in line with the holes for receiving the electrical or mechanical parts, (b) introducing into the mold molten plastic and allowing same to cool to form a first segment of insulating material with first and second end units and middle units containing holes, (c) removing from the mold the first segment and reinserting the second end unit of the first segment in the mold, (d) introducing into the mold molten plastic and allowing same to cool to form a second segment with first and second end units and middle units with the first end unit of the second segment overlapping with the second end unit of the first segment whereby the first and second segments are integrally coupled by their respective second and first end units with their respective holes aligned, (e) repeating step (c) with respect to the second segment and step (d) to form a third segment integrally coupled with the second segment, and so on, whereby successive segments can be formed and integrally coupled to form an elongated length of insulating material.

10. The method of claim 9, further comprising the step of:

(f) inserting electrical contacts or mechanical parts into some of the holes of the middle regions.

11. The method of claim 9, further comprising the step of:

(f) inserting electrical contacts or mechanical parts into some of the aligned holes of the overlapping end units.

12. The method of claim 9, wherein the second end unit comprises a generally knob-shaped protuberance generally in-line with the holes.

13. The method of claim 12, wherein the strength of plastic of the second end unit is approximately one-half that of the combination of the second end unit and the overlapped first end unit.

14. The method of claim 12, wherein the volume of plastic of the second end unit is approximately one-half that of the combination of the second end unit and the overlapped first end unit.

15. The method of claim 9, wherein after step (c), and before step (d), a core pin is inserted in the second end unit reinserted in the mold for maintaining in the second segment the same pitch as in the first segment.

16. A method of forming a continuous elongated injection-molded length of insulating material containing a plurality of spaced in-line electrical contacts inserted through and along the entire length of said insulating material, comprising the steps:

(a) providing a mold shaped to form one segment of insulating material, said one segment comprising a consecutive series of connected, integral, insulated units comprised of first leading and second trailing end units and a plurality of middle units between the end units, said middle units each being of insulating material and separated along their length from each other by aligned sets of notches, each middle and end unit containing a hole for receiving an electrical contact, the first and second end units forming projecting portions in line with the holes for receiving the electrical contacts, (b) introducing into the mold molten plastic and allowing same to cool to form a first segment of insulating material with first leading and second trailing end units and middle units each containing a hole, (c) removing from the mold the first segment and reinserting the second trailing end unit of the first segment in the mold, (d) introducing into the mold molten plastic and allowing same to cool to form a second segment with first leading and second trailing end units and middle units with the second trailing end unit of the first segment being nested within the first leading end unit of the second segment whereby the first and second segments are integrally coupled by their respective second and first end units with their respective holes aligned to receive a common electrical contact, (e) repeating step (c) with respect to the second segment and step (d) to form a third segment integrally coupled with the second segment, and so on, whereby successive segments can be formed and integrally coupled to form an elongated length of notched insulating material, (f) inserting electrical contacts into each of the holes of the middle units and into the aligned holes of the nested end units.

17. The method of claim 16, wherein step (c) is carried out by ejecting the segment from the mold, indexing the segment until its second trailing end unit remains adjacent the mold, and reinserting the second trailing end unit into the mold.

18. The method of claims 17, further comprising inserting a core pin into the hole of the trailing end unit reinserted into the mold to align same with respect to the second segment to be molded.

19. The method of claim 17, further comprising reinserting in the mold in step (c) the middle unit next to the second trailing end unit of the first segment.

20. The method of claim 19, wherein a core pin is also inserted in the hole in the reinserted middle unit to align same with respect to the second segment to be molded.

21. The method of claim 17, further comprising the step of winding the continuous length onto a reel.

* * * * *

UNITED STATES PATENT AND TRADEMARK OFFICE
CERTIFICATE OF CORRECTION

PATENT NO. : 5,616,053
DATED : Apr. 1, 1997
INVENTOR(S) : Robert M. Bogursky et al.

It is certified that error appears in the above-identified patent and that said Letters Patent is hereby corrected as shown below:

Cover Page: Item [73]  Assignee should read --Autosplice Systems, Inc.--.

Column 8, line 7, "(f)" should read --(d)--.

Signed and Sealed this

Seventeenth Day of June, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,616,053
DATED : April 1, 1997
INVENTOR(S) : Robert M. Bogursky et al.

It is certified that error appears in the above-indentified patent and that said Letters Patent is hereby corrected as shown below:

Column 8, line 7, "pans" should read --parts--.

Signed and Sealed this

Twenty-first Day of October 1997

Attest:

BRUCE LEHMAN

Attesting Officer

Commissioner of Patents and Trademarks